(12) United States Patent
Li et al.

(10) Patent No.: US 11,949,409 B2
(45) Date of Patent: Apr. 2, 2024

(54) LOW-POWER PULSE OUTPUT CIRCUIT

(71) Applicant: Wenzhou University, Zhejiang (CN)

(72) Inventors: Xiangyu Li, Zhejiang (CN); Pengjun Wang, Zhejiang (CN); Gang Li, Zhejiang (CN)

(73) Assignee: Wenzhou University, Zhejiang (CN)

( * ) Notice: Subject to any disclaimer, the term of this patent is extended or adjusted under 35 U.S.C. 154(b) by 0 days.

(21) Appl. No.: 18/151,477

(22) Filed: Jan. 9, 2023

(65) Prior Publication Data

US 2024/0063786 A1    Feb. 22, 2024

(30) Foreign Application Priority Data

Aug. 19, 2022   (CN) .......................... 202211002996.0

(51) Int. Cl.
*H03K 17/22*   (2006.01)
*G06F 1/24*    (2006.01)

(52) U.S. Cl.
CPC ............ *H03K 17/223* (2013.01); *G06F 1/24* (2013.01)

(58) Field of Classification Search
None
See application file for complete search history.

(56) References Cited

U.S. PATENT DOCUMENTS

| | | | | |
|---|---|---|---|---|
| 4,812,679 A | * | 3/1989 | Mahabadi ............ | H03K 17/223 327/143 |
| 4,885,476 A | * | 12/1989 | Mahabadi ............ | H03K 17/223 327/143 |
| 6,181,173 B1 | * | 1/2001 | Homol ................. | H03K 17/223 327/143 |

FOREIGN PATENT DOCUMENTS

| | | |
|---|---|---|
| CN | 101753119 | 12/2011 |
| CN | 107733407 | 9/2020 |

* cited by examiner

*Primary Examiner* — Jeffrey S Zweizig
(74) *Attorney, Agent, or Firm* — JCIPRNET

(57) ABSTRACT

A low-power pulse output circuit comprises first to third PMOS transistors, first NMOS to third NMOS transistors, a resistor regulation module, a capacitor regulation module, an inverter and a buffer. Drains of the first PMOS and first NMOS transistors, gates of the first NMOS, second PMOS, second NMOS, and third NMOS transistors are connected. Drain of the second PMOS transistor, gate of the third PMOS transistor and one terminal of the resistor regulation module are connected. The other terminal of the resistor regulation module and drain of the second NMOS transistor are connected. Drain of the third PMOS transistor, drain of the third NMOS transistor and an input terminal of the inverter are connected. An output terminal of the inverter, the other terminal of the capacitor regulation module and an input terminal of the buffer are connected.

4 Claims, 2 Drawing Sheets

LOW-POWER PULSE OUTPUT CIRCUIT

CROSS-REFERENCE TO RELATED APPLICATION

This application claims the priority benefit of China application no. 202211002996.0, filed on Aug. 19, 2022. The entirety of each of the above mentioned patent applications is hereby incorporated by reference herein and made a part of this specification.

BACKGROUND

1. Technical Field

The present disclosure relates to a pulse output circuit, in particular to a low-power pulse output circuit.

2. Description of Related Art

With the advancing in microelectronics technology and the improvement of integration, existing information processing chips become increasingly complexed. Various analogue functional units and a digital logic unit are integrated on the chip, wherein the digital logic unit provides calibration for the analogue functional units to improve performance of the chip, and final calibration data is stored in an electrically-erasable programmable read-only memory (EEPROM) or a one-time programmable memory (OTP). An intermediate state exists in the chip during the power-on process, and particularly, when circuit units such as an oscillator unit and a clock circuit are powered on, a reset circuit (pulse output circuit) is needed to provide a pulse reset signal.

Chinese Patent Publication No. CN101753119B provides a power-on reset circuit, of which a voltage division part comprises at least two NMOS transistors which are connected in series between a power terminal and a ground, and a voltage detection part comprises an NMOS transistor and a PMOS transistor. The voltage division part of the power-on reset circuit uses at least two NMOS transistors connected in series to replace an existing voltage divider resistor. The circuit structure is simple, the chip area occupied by the circuit is small, the operating current is decreased, and power consumption is low. However, due to the fact that the power-on reset circuit detects a power-on signal by means of voltage division through at least two NMOS transistors connected in series, a reset signal is generated quickly, generally with μs-level power-on reset delay, after the voltage reaches the threshold voltage of the NMOS transistors since at least two NMOS transistors are powered by a supply voltage VCC, which makes it difficult for the circuit to be applied at case of a longer reset delay.

Chinese Patent Publication No. CN107733407B provides a power-on reset circuit capable of realizing quick charging and discharging and controllable reset time. The power-on reset circuit charges a capacitor with current to generate a voltage, which is then compared with a reference voltage, a comparator generates a level jump signal (power-on detection threshold), and then a reset signal is generated according to the jump signal. Thus, the power-on reset delay of the power-on reset circuit is controllable, and reset signals can be generated both under short power-on reset delay and long power-on reset delays. However, the power-on reset circuit generates the reference voltage relying on a reference circuit on the chip, and an active comparator circuit is needed for comparing the power-on detection threshold, so the power-on reset circuit consumes large power and has a complexed circuit structure, and occupies a large chip area.

SUMMARY

The technical issue to be settled by the present disclosure is to provide a low-power pulse output circuit, which is simple in circuit structure and low in power, occupies a small chip area, and can generate reset signals both under short power-on reset delay and long power-on reset delay.

The technical solution adopted by the present disclosure to settle the above technical issue is as follows: a low-power pulse output circuit comprises a first PMOS transistor, a second PMOS transistor, a third PMOS transistor, a first NMOS transistor, a second NMOS transistor, a third NMOS transistor, a resistor regulation module, a capacitor regulation module, an inverter and a buffer, wherein a resistance of the resistor regulation module is adjustable, a capacitance of the capacitor regulation module is adjustable, a gate of the first PMOS transistor, a source of the first NMOS transistor, a source of the second NMOS transistor, a source of the third NMOS transistor and one terminal of the capacitor regulation module are grounded, a source of the first PMOS transistor, a source of the second PMOS transistor and a source of the third PMOS transistor are connected, a connecting terminal is a power terminal of the low-power pulse output circuit, a supply voltage VCC is accessed to the power terminal of the low-power pulse output circuit, a drain of the first PMOS transistor, a drain of the first NMOS transistor, a gate of the first NMOS transistor, a gate of the second PMOS transistor, a gate of the second NMOS transistor and a gate of the third NMOS transistor are connected, a drain of the second PMOS transistor, a gate of the third PMOS transistor and one terminal of the resistor regulation module are connected, another terminal of the resistor regulation module and a drain of the second NMOS transistor are connected, a drain of the third PMOS transistor, a drain of the third NMOS transistor and an input terminal of the inverter are connected, an output terminal of the inverter, another terminal of the capacitor regulation module and an input terminal of the buffer are connected, an output terminal of the buffer is an output terminal of the low-power pulse output circuit, and the output terminal of the low-power pulse output circuit is used for outputting reset signals.

The resistor regulation module comprises n resistors and n first switches, wherein n is an integer greater than or equal to 2. One terminal of each of the n resistors are connected together, and taken as one terminal of the resistor regulation module. Another terminal of the $j^{th}$ resistor is connected to one terminal of the $j^{th}$ first switch. Another terminal of each of the n first switches are connected together, and taken as the other terminal of the resistor regulation module, where j=1, 2, . . . , n.

The n resistors are all high-poly resistors.

The capacitor regulation module comprises m capacitors and m second switches, wherein m is an integer greater than or equal to 2; one terminal of each of the m capacitors are connected together, and taken as one terminal of the capacitor regulation module. Another terminal of the $k^{th}$ capacitor is connected to one terminal of the $k^{th}$ second switch. Another terminal of each of the m second switches are connected together, and taken as another terminal of the capacitor regulation module, where k=1, 2, . . . , m.

Compared with the prior art, the present disclosure has the following advantages: the low-power pulse output circuit is formed by a first PMOS transistor, a second PMOS transistor, a third PMOS transistor, a first NMOS transistor, a second NMOS transistor, a third NMOS transistor, a resistor regulation module, a capacitor regulation module, an inverter and a buffer, a resistance of the resistor regulation module is adjustable, a capacitance of the capacitor regulation module is adjustable, a gate of the first PMOS transistor, a source of the first NMOS transistor, a source of the second NMOS transistor, a source of the third NMOS transistor and one terminal of the capacitor regulation module are grounded, a source of the first PMOS transistor, a source of the second PMOS transistor and a source of the third PMOS transistor are connected, a connecting terminal is a power terminal of the low-power pulse output circuit, a supply voltage VCC is accessed to the power terminal of the low-power pulse output circuit, a drain of the first PMOS transistor, a drain of the first NMOS transistor, a gate of the first NMOS transistor, a gate of the second PMOS transistor, a gate of the second NMOS transistor and a gate of the third NMOS transistor are connected, a drain of the second PMOS transistor, a gate of the third PMOS transistor and one terminal of the resistor regulation module are connected, the other terminal of the resistor regulation module and a drain of the second NMOS transistor are connected, a drain of the third PMOS transistor, a drain of the third NMOS transistor and an input terminal of the inverter are connected, an output terminal of the inverter, the other terminal of the capacitor regulation module and an input terminal of the buffer are connected, an output terminal of the buffer is an output terminal of the low-power pulse output circuit, and the output terminal of the low-power pulse output circuit is used for outputting reset signals. When the supply voltage VCC is accessed to the power terminal of the low-power pulse output circuit, because the gate of the first PMOS transistor is grounded, the first PMOS transistor will be turned on (i.e., conductive) when the supply voltage VCC is increased to a certain value. At this moment, a current flows across the first NMOS transistor, voltages at the drain and the gate of the first NMOS transistor rise slowly, while voltage at the gate of the second NMOS transistor rises slowly at the same time, causing the second NMOS transistor at an off state (i.e., nonconductive) until the voltage at the gate of the second NMOS transistor reaches a threshold voltage of the second NMOS transistor. At this moment, the voltage of one terminal of the resistor regulation module and the voltage at the gate of the third PMOS transistor are at a low level, and the voltage at the gate of the third PMOS transistor is lower than a threshold voltage of the third PMOS transistor. The third PMOS transistor will not be turned on (i.e., conductive) until the voltage at the gate of the third PMOS transistor rises to the threshold voltage of the third PMOS transistor. However, the voltage at the drain of the third PMOS transistor is risen as the supply voltage VCC increases until the voltage at the gate of the first NMOS transistor, the second NMOS transistor and the third NMOS transistor rises to be equal to a threshold voltage of the gate of the second PMOS transistor, which causes a branch formed by the second PMOS transistor, the resistor regulation module and the second NMOS transistor to be turned on (i.e., conductive), and the voltage of one terminal of the resistor regulation module quickly rising to be close to the supply voltage VCC. At this moment, the third PMOS transistor is turned off (i.e., nonconductive), the voltage accessed from the input terminal of the inverter is instantly pulled down with the increase of the supply voltage VCC. At the same time, a signal output by the output terminal of the inverter is pulled from a low level to a high level, and the output terminal of the inverter generates a reset signal, which is delayed by the capacitor regulation module, then enters the buffer, and is finally output by the output terminal of the buffer. According to the present disclosure, the power-on detection threshold is controlled by adjusting the resistance of the resistor regulation module, the reset delay time is controlled by adjusting the capacitance of the capacitor regulation module, so the operations are easy and reliable, reset signals can be generated both under short power-on reset delay and long power-on reset delays, the overall circuit structural is simple, the circuit occupies a small chip area, a high-precision reference source and a comparator are not needed, and chip power is saved.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The present disclosure will be described in further detail below in conjunction with the accompanying drawings and embodiments.

Embodiment

Figure 1:
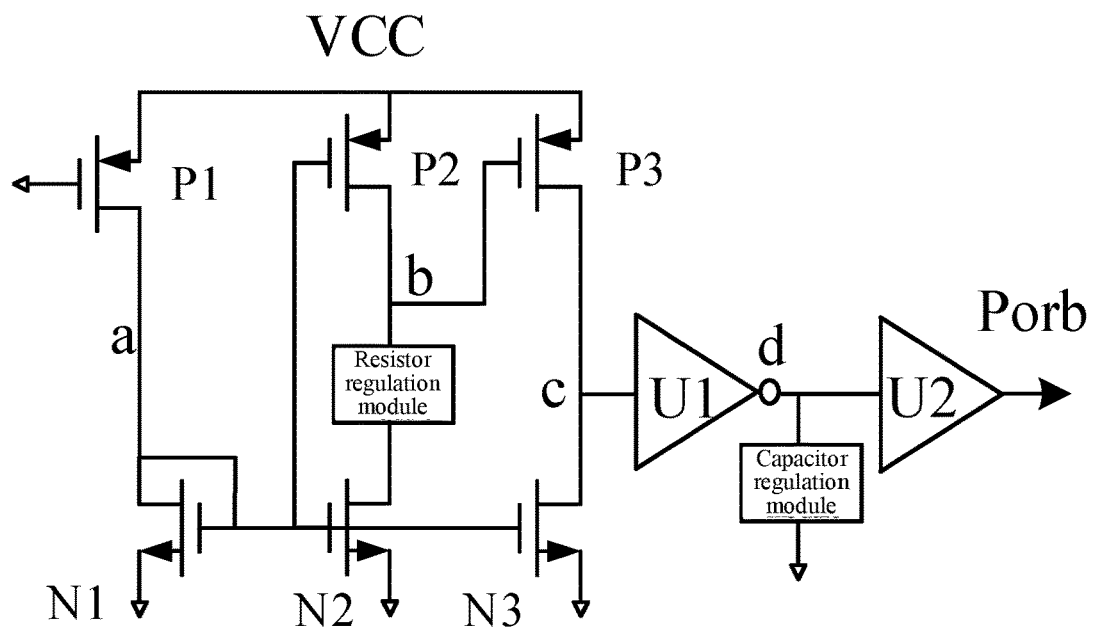
FIG. 1 is a circuit diagram of a low-power pulse output circuit according to the present disclosure.

As shown in FIG. 1, a low-power pulse output circuit comprises a first PMOS transistor P1, a second PMOS transistor P2, a third PMOS transistor P3, a first NMOS transistor N1, a second NMOS transistor N2, a third NMOS transistor N3, a resistor regulation module, a capacitor regulation module, an inverter U1 and a buffer U2, wherein a resistance of the resistor regulation module is adjustable, a capacitance of the capacitor regulation module is adjustable, a gate of the first PMOS transistor P1, a source of the first NMOS transistor N1, a source of the second NMOS transistor N2, a source of the third NMOS transistor N3 and one terminal of the capacitor regulation module are grounded, a source of the first PMOS transistor P1, a source of the second PMOS transistor P2 and a source of the third PMOS transistor P3 are connected, a connecting terminal is a power terminal of the low-power pulse output circuit, a supply voltage VCC is accessed to the power terminal of the low-power pulse output circuit, a drain of the first PMOS transistor P1, a drain of the first NMOS transistor N1, a gate of the first NMOS transistor N1, a gate of the second PMOS transistor P2, a gate of the second NMOS transistor N2 and a gate of the third NMOS transistor N3 are connected, a drain of the second PMOS transistor P2, a gate of the third PMOS transistor P3 and one terminal of the resistor regulation module are connected, another terminal of the resistor regulation module and a drain of the second NMOS transistor N2 are connected, a drain of the third PMOS transistor P3, a drain of the third NMOS transistor N3 and an input terminal of the inverter U1 are connected, an output terminal of the inverter U1, another terminal of the capacitor regulation module and an input terminal of the buffer U2 are connected, an output terminal of the buffer U2 is an output terminal of the low-power pulse output circuit, and the output terminal of the low-power pulse output circuit is used for outputting reset signals.

The working principle of the low-power pulse output circuit of the present disclosure is as follows: when the supply voltage VCC is accessed to the power terminal of the low-power pulse output circuit, because the gate of the first PMOS transistor P1 is grounded, the first PMOS transistor P1 will be turned on (i.e., conductive) when the supply voltage VCC is increased to a certain value. At this moment, a current flows across the first NMOS transistor N1, voltages at the drain and the gate of the first NMOS transistor N1 rise slowly, while voltage at the gate of the second NMOS transistor N2 rises slowly at the same time, causing the second NMOS transistor N2 at an off state (i.e., nonconductive) until the voltage at the gate of the second NMOS transistor N2 reaches a threshold voltage of the second NMOS transistor N2. At this moment, the voltage of one terminal of the resistor regulation module and the voltage at the gate of the third PMOS transistor P3 are at a low level, and the voltage at the gate of the third PMOS transistor P3 is lower than a threshold voltage of the third PMOS transistor P3. The third PMOS transistor P3 will not be turned on (i.e., conductive) until the voltage at gate of the third PMOS transistor P3 rises to the threshold voltage of the third PMOS transistor P3. However, the voltage at the drain of the third PMOS transistor P3 is risen as the supply voltage VCC increases until the voltage at the gate of the first NMOS transistor N1, the second NMOS transistor N2 and the third NMOS transistor N3 rises to be equal to a threshold voltage of the gate of the second PMOS transistor P2, which causes a branch formed by the second PMOS transistor P2, the resistor regulation module and the second NMOS transistor N2 to be turned on (i.e., conductive), and the voltage of one terminal of the resistor regulation module quickly rising to be close to the supply voltage VCC. At this moment, the third PMOS transistor P3 is turned off, the voltage accessed from the input terminal of the inverter U1 is instantly pulled down with the increase of the supply voltage VCC. At the same time, a signal output by the output terminal of the inverter U1 is pulled from a low level to a high level, and the output terminal of the inverter U1 generates a reset signal, which is delayed by the capacitor regulation module, then enters the buffer U2, and is finally output by the output terminal of the buffer U2. According to the present disclosure, the power-on detection threshold is controlled through the resistor regulation module, the reset delay time is controlled through the capacitor regulation module, so the operations are easy and reliable.

Figure 2:
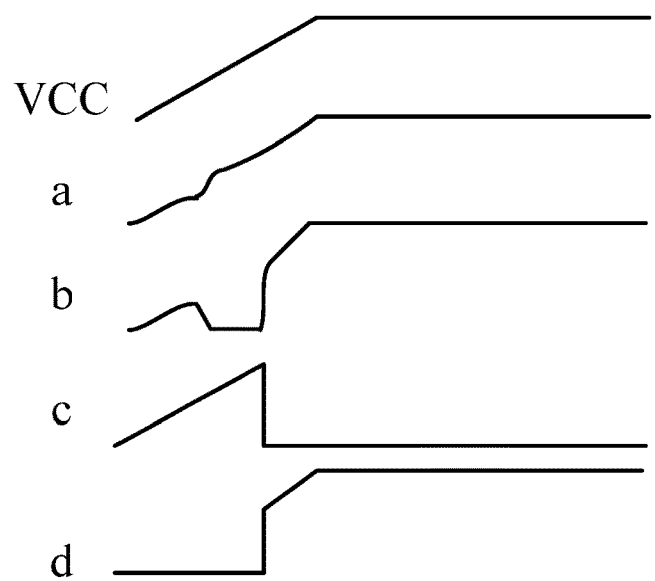
FIG. 2 is an oscillogram of key nodes in the low-power pulse output circuit according to the present disclosure.

FIG. 2 is a diagram of waveforms of key nodes in the low-power pulse output circuit according to the present disclosure. In FIG. 2, a represents a waveform of a connecting node a in FIG. 1 which the drain of the first PMOS transistor P1, the gate of the first NMOS transistor N1, the drain of the first NMOS transistor N1, the gate of the second NMOS transistor N2, the gate of the third NMOS transistor N3 and the gate of the second PMOS transistor P2 are coupled to, b represents a waveform of a connecting node b in FIG. 1 which the drain of the second PMOS transistor P2, the gate of the third PMOS transistor P3 and one terminal of the resistor regulation module are coupled to, c represents a waveform of a connecting node c in FIG. 1 which the drain of the third PMOS transistor P3, the drain of the third NMOS transistor N3 and the input terminal of the inverter are coupled to, and a waveform d represents a connecting node which the output terminal of the inverter U1, the other terminal of the capacitor regulation module and the input terminal of the buffer U2 are coupled to. It can be known, by analyzing FIG. 2, that the voltage of the node a changes simultaneously as the supply voltage VCC is powered-on. The voltage of the waveform b rises to a certain value at the beginning, and then pulled down. The voltage of the waveform b rises again until the second PMOS transistor P2 is turned on (i.e., conductive). The rise voltage detection threshold of the node c is controlled by the resistor regulation module, and is pulled down when rising to a required power-on detection threshold, which initiates the reset delay so that the reset signal is generated at the node d. The reset signal is delayed by the capacitor regulation module, then buffered by the buffer U2, and is finally output. As can be seen from FIG. 2, the low-power pulse output circuit provided by the present disclosure generates an expected reset signal.

Figure 3:
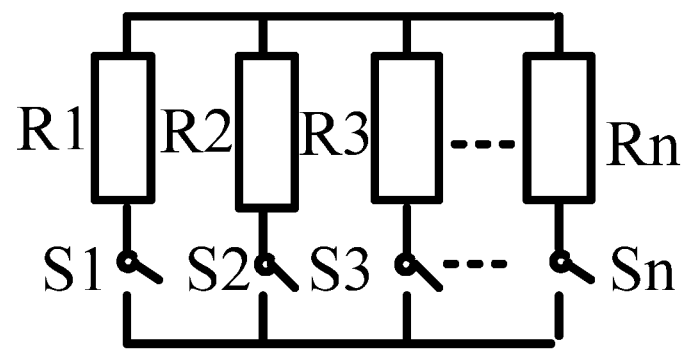
FIG. 3 is a circuit diagram of a resistor regulation module of the low-power pulse output circuit according to the present disclosure.

As shown in FIG. 3, in this embodiment, the resistor regulation module comprises n resistors R1-Rn and n first switches S1-Sn, wherein n is an integer greater than or equal to 2; one terminal of each of the n resistors R1-Rn are connected together, and taken as one terminal of the resistor regulation module. Another terminal of the $j^{th}$ resistor Rj is connected to one terminal of the $j^{th}$ first switch Sj. Another terminal of each of then first switches S1-Sn are connected together, and taken as the other terminal of the resistor regulation module, where j=1, 2, . . . , n. When the n first switches S1-Sn in the resistor regulation module are all turned on (i.e., conductive), the resistance of the resistor regulation module is minimized. The resistance of the resistor regulation module decreases as the number of how many first switches in then first switches S1-Sn are turned on (i.e., conductive) increases.

In this embodiment, the n resistors are all high-poly resistors.

Figure 4:
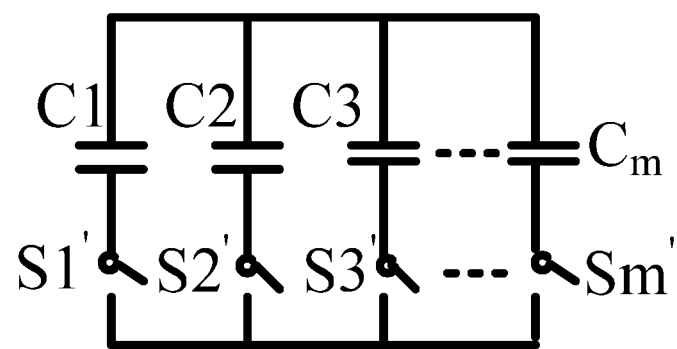
FIG. 4 is circuit diagram of a capacitor regulation module of the low-power pulse output circuit according to the present disclosure.

As shown in FIG. 4, in this embodiment, the capacitor regulation module comprises m capacitors C1-Cm and m second switches S'1-S'm, wherein m is an integer greater than or equal to 2; one terminal of each of the m capacitors C1-Cm are connected together, and taken as one terminal of the capacitor regulation module. Another terminal of the $k^{th}$ capacitor Ck is connected to one terminal of the $k^{th}$ second switch S'k. Another terminal of each of the m second switches S'1-S'm are connected together, and taken as the other terminal of the capacitor regulation module, where k=1, 2, . . . , m. When the m second switches S'1-S'm in the capacitor regulation module are all turned on (i.e., conductive), the capacitance of the capacitor regulation module is maximized, and the capacitance of the capacitor regulation module increases as the number of how many second switches in the m second switches S'1-S'm are turned on (i.e., conductive) increases.

The low-power pulse output circuit is simple in circuit structure requires low power consumption, occupies a small chip area, and capable of generating reset signals both under short power-on reset delay and long power-on reset delays.

What is claimed is:

1. A low-power pulse output circuit, comprising a first PMOS transistor, a second PMOS transistor, a third PMOS transistor, a first NMOS transistor, a second NMOS transistor, a third NMOS transistor, a resistor regulation module, a capacitor regulation module, an inverter and a buffer, wherein a resistance of the resistor regulation module is adjustable, a capacitance of the capacitor regulation module is adjustable, a gate of the first PMOS transistor, a source of the first NMOS transistor, a source of the second NMOS transistor, a source of the third NMOS transistor and one terminal of the capacitor regulation module are grounded, a source of the first PMOS transistor, a source of the second PMOS transistor and a source of the third PMOS transistor are connected, a connecting terminal is a power terminal of the low-power pulse output circuit, a supply voltage is accessed to the power terminal of the low-power pulse output circuit, a drain of the first PMOS transistor, a drain of the first NMOS transistor, a gate of the first NMOS transistor, a gate of the second PMOS transistor, a gate of the second NMOS transistor and a gate of the third NMOS transistor are connected, a drain of the second PMOS transistor, a gate of the third PMOS transistor and one terminal of the resistor regulation module are connected, another terminal of the resistor regulation module and a drain of the second NMOS transistor are connected, a drain of the third PMOS transistor, a drain of the third NMOS transistor and an input terminal of the inverter are connected, an output terminal of the inverter, another terminal of the capacitor regulation module and an input terminal of the buffer are connected, an output terminal of the buffer is an output terminal of the low-power pulse output circuit, and the output terminal of the low-power pulse output circuit is used for outputting reset signals.

2. The low-power pulse output circuit according to claim 1, wherein the resistor regulation module comprises n resistors and n first switches, wherein n is an integer greater than or equal to 2; one terminal of each of the n resistors are connected together and taken as one terminal of the resistor regulation module; another terminal of the $j^{th}$ resistor is connected to one terminal of the $j^{th}$ first switch; another terminal of each of the n first switches are connected together and taken as another terminal of the resistor regulation module, where j=1, 2, . . . , n.

3. The low-power pulse output circuit according to claim 2, wherein the n resistors are all high-poly resistors.

4. The low-power pulse output circuit according to claim 1, wherein the capacitor regulation module comprises m capacitors and m second switches, wherein m is an integer greater than or equal to 2; one terminal of each of the m capacitors are connected together and taken as one terminal of the capacitor regulation module; another terminal of the $k^{th}$ capacitor is connected to one terminal of the $k^{th}$ second switch; another terminal of each of the m second switches are connected together and taken as another terminal of the capacitor regulation module, where k=1, 2, . . . , m.

* * * * *